United States Patent
Zhou et al.

(10) Patent No.: US 11,043,648 B2
(45) Date of Patent: *Jun. 22, 2021

(54) WHITE ORGANIC ELECTROLUMINESCENT DEVICE AND PREPARATION METHOD THEREOF

(71) Applicant: Changchun Institute of Applied Chemistry Chinese Academy of Sciences, Changchun (CN)

(72) Inventors: Liang Zhou, Changchun (CN); Hongjie Zhang, Changchun (CN)

(73) Assignee: Changchun Institute of Applied Chemistry Chinese Academy of Sciences, Changchun (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/477,557

(22) PCT Filed: Aug. 18, 2017

(86) PCT No.: PCT/CN2017/098010
§ 371 (c)(1),
(2) Date: Jul. 12, 2019

(87) PCT Pub. No.: WO2018/129922
PCT Pub. Date: Jul. 19, 2018

(65) Prior Publication Data
US 2019/0363271 A1    Nov. 28, 2019

(30) Foreign Application Priority Data

Jan. 16, 2017   (CN) .......................... 201710032344.4

(51) Int. Cl.
*H01L 51/50* (2006.01)
*H01L 51/00* (2006.01)
*H01L 51/56* (2006.01)

(52) U.S. Cl.
CPC ........ *H01L 51/504* (2013.01); *H01L 51/0054* (2013.01); *H01L 51/0065* (2013.01);
(Continued)

(58) Field of Classification Search
CPC ............... H01L 51/504; H01L 51/0054; H01L 51/0065; H01L 51/0067; H01L 51/0069;
(Continued)

(56) References Cited

U.S. PATENT DOCUMENTS 7,968,214 B2    6/2011 Noh et al.
10,177,324 B2 *  1/2019 Zhou .................. H01L 51/5036
(Continued)

FOREIGN PATENT DOCUMENTS

CN    101222023    7/2008
CN    101728491    6/2010
(Continued)

OTHER PUBLICATIONS

Zhou et al. "Efficient White Electroluminescent Device with Stable Emission Spectrum" Acta Chim. Sincica, 70:1904-1908 (2012) (English abstract).
(Continued)

*Primary Examiner* — Bitew A Dinke
(74) *Attorney, Agent, or Firm* — Myers Bigel, P.A.

(57) ABSTRACT

The present disclosure provides a white organic electroluminescent device, comprising: a substrate; an anode layer; a first light emitting layer formed from a red organic fluorescent material, a first energy-sensitized organic material and a first hole-type organic host material; a second light emitting layer formed from a green organic fluorescent material, a second energy-sensitized organic material and a second hole-type organic host material; and a cathode layer.

13 Claims, 3 Drawing Sheets

(52) U.S. Cl.
CPC ...... *H01L 51/0067* (2013.01); *H01L 51/0069* (2013.01); *H01L 51/0072* (2013.01); *H01L 51/0094* (2013.01); *H01L 51/5056* (2013.01); *H01L 51/5096* (2013.01); *H01L 51/56* (2013.01)

(58) Field of Classification Search
CPC ............. H01L 51/0072; H01L 51/0094; H01L 51/5056; H01L 51/5096; H01L 51/56; H01L 51/5036; H01L 51/52
See application file for complete search history.

(56) References Cited

U.S. PATENT DOCUMENTS

| | | | |
|---|---|---|---|
| 10,290,824 B2 | 5/2019 | Nakanotani et al. | |
| 10,700,294 B2* | 6/2020 | Zhou | H01L 51/0065 |
| 10,854,820 B2* | 12/2020 | Zhou | H01L 51/5024 |
| 2003/0134146 A1* | 7/2003 | Aziz | H01L 51/0081 |
| | | | 428/690 |
| 2005/0112404 A1* | 5/2005 | Hamada | H01L 51/5036 |
| | | | 428/690 |
| 2005/0238918 A1* | 10/2005 | Igarashi | C09K 11/06 |
| | | | 428/690 |
| 2006/0214553 A1* | 9/2006 | Nagara | H01L 51/5048 |
| | | | 313/483 |
| 2008/0171226 A1 | 7/2008 | Noh et al. | |
| 2010/0090593 A1* | 4/2010 | Mori | H01L 51/009 |
| | | | 313/504 |
| 2010/0140606 A1* | 6/2010 | Shibata | H01L 51/5016 |
| | | | 257/40 |
| 2011/0233457 A1* | 9/2011 | Hyuga | C09K 11/06 |
| | | | 252/71 |
| 2011/0240967 A1* | 10/2011 | Lee | H01L 51/5004 |
| | | | 257/40 |
| 2012/0193615 A1* | 8/2012 | Shiratori | H01L 51/5092 |
| | | | 257/40 |
| 2012/0299470 A1* | 11/2012 | Kobayashi | E06B 9/386 |
| | | | 313/504 |
| 2013/0299788 A1* | 11/2013 | Sakuma | H01L 51/5028 |
| | | | 257/40 |
| 2014/0306211 A1* | 10/2014 | Okuyama | H01L 51/5253 |
| | | | 257/40 |
| 2015/0280158 A1* | 10/2015 | Ogiwara | H01L 51/5044 |
| | | | 257/40 |
| 2015/0380654 A1* | 12/2015 | Tang | H01L 51/0039 |
| | | | 257/13 |
| 2016/0141521 A1 | 5/2016 | Watanabe et al. | |
| 2017/0179417 A1* | 6/2017 | Seo | H01L 51/5056 |
| 2017/0244071 A1* | 8/2017 | Miyazaki | H01L 51/5036 |
| 2017/0309857 A1* | 10/2017 | Nakanotani | H01L 51/5024 |
| 2017/0317307 A1* | 11/2017 | Zhou | C09K 11/06 |
| 2019/0228686 A1* | 7/2019 | Tsukamoto | H01L 51/5056 |
| 2019/0305054 A1* | 10/2019 | Tsukamoto | H01L 51/0011 |
| 2020/0035926 A1* | 1/2020 | Zhou | H01L 51/0052 |
| 2020/0083472 A1* | 3/2020 | Tanaka | H05B 33/12 |

FOREIGN PATENT DOCUMENTS

| | | | | |
|---|---|---|---|---|
| CN | 101728491 A | * | 6/2010 | |
| CN | 101728491 A | * | 6/2010 | |
| CN | 101916830 | | 12/2010 | |
| CN | 101916830 A | * | 12/2010 | |
| CN | 101916830 A | * | 12/2010 | |
| CN | 102024909 A | | 4/2011 | |
| CN | 102024909 A | * | 4/2011 | |
| CN | 104269496 A | * | 1/2015 | |
| CN | 104269496 A | * | 1/2015 | |
| CN | 106816542 | | 6/2017 | |
| CN | 106816542 A | * | 6/2017 | |
| CN | 106816542 A | * | 6/2017 | ......... H01L 51/5036 |
| JP | 2007150191 A | | 6/2007 | |
| JP | 2016092134 A | | 5/2016 | |
| JP | 2016519834 A | | 7/2016 | |

OTHER PUBLICATIONS

International Search Report and Written Opinion corresponding to PCT/CN2017/098010, dated Nov. 1, 2017 (16 pages to include English translation).

"Extended European Search Report for corresponding European Application No. 17891345.5, dated Sep. 16, 2020 (10 pages)".

"Japanese Office Action corresponding to Japanese Patent Application No. 2019-538146, dated Aug. 31, 2020 (5 pages)".

Kim, et al., "Color Optimization of Single Emissive White OLEDs Via Energy Transfer between RGB Fluorescent Dopants", Journal of Luminescence 143 (2013) 723-728.

* cited by examiner

WHITE ORGANIC ELECTROLUMINESCENT DEVICE AND PREPARATION METHOD THEREOF

CROSS REFERENCE TO RELATED APPLICATION

The present application is a 35 U.S.C. § 371 national phase application of International Application Serial No. PCT/CN2017/098010, filed Aug. 18, 2017, which claims a priority benefit of Chinese Patent Application No. 201710032344.4, filed on Jan. 16, 2017, with a title of "White organic electroluminescent device and preparation method thereof", the entirety of which is incorporated herein by reference. The above-referenced PCT International Application was published in the Chinese language as International Publication No. WO 2018/129922 on Jul. 19, 2018.

TECHNICAL FIELD

The present disclosure relates to the technical field of organic electroluminescence, and particularly to a white organic electroluminescent device and a preparation method thereof.

BACKGROUND

An organic luminescent device is a device which spontaneously emits light. When charges are injected into an organic film between an electron injection electrode (an anode) and a hole injection electrode (a cathode), electrons and holes are combined and then annihilated to produce light. As compared to other flat display technologies such as liquid crystal display, plasma display device and field emission display, organic electroluminescent display has a series of excellent properties such as tunable luminescence color, active luminescence, high luminance, high efficiency, wide view angle, low energy consumption, simple preparation process, capability of preparing curved and flexible display screen, and so on, and has a wide application prospect in the field of large planar flat panel full color display, so it is considered as the most competitive new generation display technology. Therefore, research on organic electroluminescent technology has attracted more and more attentions and active participation of scientists and technicians in scientific community and industry community, such that the performances of organic electroluminescent device have been developed rapidly over the past decade. Among others, white organic electroluminescent devices have become a hot spot of investigation due to the wide application prospect in full color display, high-end lighting, or the like.

R&D (Research and Development) and design of high performance and high quality white organic electroluminescent device have always been key and hot point in the field. Transition metal complexes are regarded as ideal organic electroluminescent material in the academic community and industry community, due to their advantages such as high luminescence efficiency, tunable luminescence color, and so on. Many research groups, both domestic and abroad, set about material synthesis and device optimization, trying to improve the overall performances of white organic electroluminescent devices in order to satisfy the requirements for industrialization. However, white organic electroluminescent devices obtained based on transition metal complexes are usually accompanied by low operating life, low color stability, or high manufacture cost. Therefore, more and more research groups tend to replace transition metal complexes with fluorescence luminescent materials to obtain completely fluorescent white organic electroluminescent devices. However, fluorescent materials generally have low luminescence efficiency. In addition, the electrical conductivity and thermostability of fluorescent materials are generally poor, ultimately leading to imbalance in injection, transport and distribution of carriers. As a result, the white fluorescent devices prepared have relatively low luminescence efficiency, relatively high operation voltage, and relatively low operation stability.

In order to solve these problems, domestic and abroad research groups devote themselves to design of new fluorescent material and optimization of white light device structure. For example, Dongge M A et al. at Changchun Institute of Applied Chemistry, Chinese Academy of Sciences, published a research article in Organic Electronics in 2009, which reported that a completely fluorescent white light device with excellent properties was obtained by doping organic fluorescent materials with three colors of red, green and blue into different light emitting layers. The device obtained had high efficiency, luminance and color restoration coefficient. However, the complex device structure resulted in not only complex manufacture process, but also poor spectral stability of the device. In addition, the device had a relatively high operation voltage, which was disadvantageous for the improvement of device operation stability. In 2014, Chun-Sing Lee et al. at City University of Hong Kong published a research article in Organic Electronics, which reported that a white light device was obtained by doping an orange luminescent material into a sky-blue luminescent material to form a light emitting layer, significantly simplifying the structure of device. Although the obtained white light device had a low operation voltage (which was beneficial for improving the operation stability), the too simple light emitting layer design resulted in a relatively low color restoration coefficient and a relatively poor spectral stability of the device. Thus, the overall performances of white organic electroluminescent device, including luminescence efficiency, luminance, color restoration coefficient, spectral stability, operation stability and so on, have not been substantially improved yet.

SUMMARY

In view of the above, the technical problem to be solved by the present disclosure is to provide a white organic electroluminescent device and a preparation method thereof. The white organic electroluminescent device has simple structure, and relatively high efficiency, luminance and operation stability.

The present disclosure provides a white organic electroluminescent device, comprising:

a substrate;

an anode layer disposed on the substrate;

a first light emitting layer disposed on the anode layer, the first light emitting layer being formed from a red organic fluorescent material, a first energy-sensitized organic material and a first hole-type organic host material, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a blue organic fluorescent material with matched energy level and energy;

a second light emitting layer disposed on the first light emitting layer, the second light emitting layer being formed from a green organic fluorescent material, a second energy-sensitized organic material and a second hole-type organic host material, wherein the green organic fluorescent material is 0.1% to 2.0% by mass of the second hole-type organic host material, the second energy-sensitized organic material is 8.0% to 25.0% by mass of the second hole-type organic host material, and the second energy-sensitized organic material is a blue organic fluorescent material with matched energy level and energy; and a cathode layer disposed on the second light emitting layer.

Preferably, the red organic fluorescent material is rubrene and/or 4-dicyanomethylene-2-tert-butyl-6-(1,1,7,7-tetramethyljulolidin-4-yl-vinyl)-4H-pyran;

the green organic fluorescent material is N,N'-dimethylquinacridone and/or 2,3,6,7-tetrahydro-1,1,7,7-tetramethyl-1H,5H,11H-10-(2-benzothiazolyl)-quinolizino[9,9A,1GH]coumarin.

Preferably, the first and second energy-sensitized organic materials are 2,2'-(9,10-anthracenediyl-di-4,1-phenylene)bis[6-methyl-benzothiazole].

Preferably, the first and second hole-type organic host materials are each independently one or more selected from the group consisting of 4,4'-di(9-carbazolyl)biphenyl, 1,3-di(carbazol-9-yl)benzene, 9,9'-(5-(triphenylsilyl)-1,3-phenylene)bis-9H-carbazole, 1,3,5-tri(9-carbazolyl)benzene, 4,4',4''-tri(carbazol-9-yl)triphenylamine and 4,4'-bis(triphenylsilyl)biphenyl.

Preferably, the first light emitting layer has a thickness of from 5 to 10 nm, and the second light emitting layer has a thickness of from 2 to 5 nm.

Preferably, an anode interface layer is further disposed between the anode layer and the first light emitting layer, wherein the anode interface layer has a thickness of from 2 to 10 nm.

Preferably, a hole transport layer or electron blocking layer is further disposed between the anode layer and the first light emitting layer, wherein the hole transport layer or electron blocking layer has a thickness of from 40 to 60 nm. In the presence of the anode interface layer, the hole transport layer or electron blocking layer is disposed between the anode interface layer and the light emitting layer.

Preferably, a hole blocking layer or electron transport layer is further disposed between the second light emitting layer and the cathode layer, wherein the hole blocking layer or electron transport layer has a thickness of from 40 to 60 nm.

Preferably, a buffer layer is further disposed between the hole blocking layer or electron transport layer and the cathode layer, wherein the buffer layer has a thickness of from 0.8 to 1.2 nm.

The present disclosure further provides a preparation method of a white organic electroluminescent device, comprising the following steps:

forming an anode layer on a substrate;

forming a first light emitting layer on the anode layer, the first light emitting layer being formed from a red organic fluorescent material, a first energy-sensitized organic material and a first hole-type organic host material, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a blue organic fluorescent material with matched energy level and energy;

forming a second light emitting layer on the first light emitting layer, the second light emitting layer being formed from a green organic fluorescent material, a second energy-sensitized organic material and a second hole-type organic host material, wherein the green organic fluorescent material is 0.2% to 2.0% by mass of the second hole-type organic host material, the second energy-sensitized organic material is 8.0% to 25.0% by mass of the second hole-type organic host material, and the second energy-sensitized organic material is a blue organic fluorescent material with matched energy level and energy; and forming a cathode on the second light emitting layer, thereby obtaining the white organic electroluminescent device.

The present disclosure provides a white organic electroluminescent device, comprising: a substrate; an anode layer disposed on the substrate; a first light emitting layer disposed on the anode layer, the first light emitting layer being formed from a red organic fluorescent material, a first energy-sensitized organic material and a first hole-type organic host material, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a blue organic fluoresced material with matched energy level and energy; a second light emitting layer disposed on the first light emitting layer, the second light emitting layer being formed from a green organic fluorescent material, a second energy-sensitized organic material and a second hole-type organic host material, wherein the green organic fluorescent material is 0.2% to 2.0% by mass of the second hole-type organic host material, the second energy-sensitized organic material is 8.0% to 25.0% by mass of the second hole-type organic host material, and the second energy-sensitized organic material is a blue organic fluorescent material with matched energy level and energy; and a cathode layer disposed on the second light emitting layer. As compared to prior art, a blue organic fluorescent material is used as luminescent material and energy-sensitized material in the present disclosure, which can effectively transfer photon energy to a red organic fluorescent material or a green organic fluorescent material. Meanwhile, the blue organic fluorescent material also has excellent electron transport capability, and as it is doped in the light emitting layer at a high concentration, the blue organic fluorescent material can function as an electron-type host material, which is beneficial for balancing the distribution of holes and electrons in the light emitting region, can confine the recombination of holes and electrons within the narrow region of the light emitting layer, and can effectively balance the distribution of carriers in the light emitting layer. In addition, the device provided in the present disclosure has simple structure and low cost, and all materials thereof have good thermostability, which is beneficial for improving the lifetime of the device.

DETAILED DESCRIPTION

Figure 1:
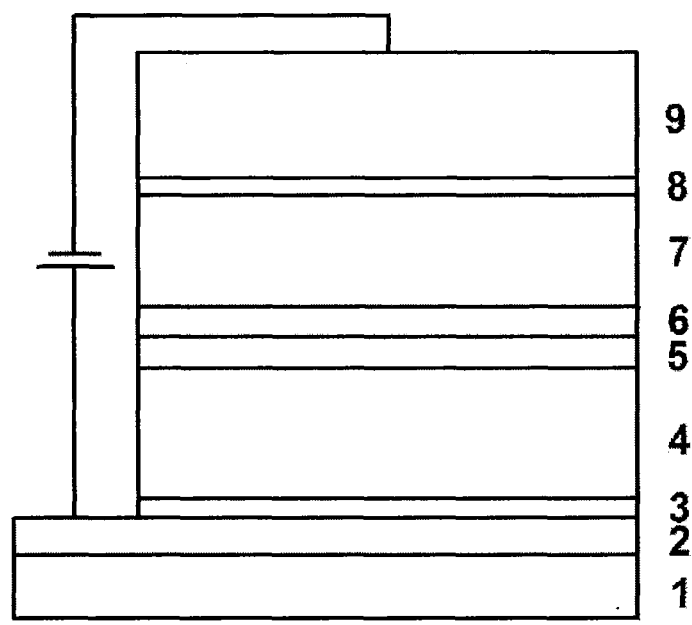
FIG. 1 is a schematic structural diagram of a white organic electroluminescent device provided in the present disclosure.

The technical solutions in embodiments of the present disclosure will be detailedly described below in combination with the embodiments of the present disclosure. Obviously, the embodiments described are only a part of, not all of the embodiments of the present disclosure. All of other embodiments obtained by those skilled in the art based on the embodiments of the present disclosure, without inventive efforts, fall within the protection scope of the present invention.

The present disclosure provides a white organic electroluminescent device, comprising:
a substrate;
an anode layer disposed on the substrate;
a first light emitting layer disposed on the anode layer, the first light emitting layer being formed from a red organic fluorescent material, a first energy-sensitized organic material and a first hole-type organic host material, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a blue organic fluorescent material with matched energy level and energy;
a second light emitting layer disposed on the first light emitting layer, the second light emitting layer being formed from a green organic fluorescent material, a second energy-sensitized organic material and a second hole-type organic host material, wherein the green organic fluorescent material is 0.2% to 2.0% by mass of the second hole-type organic host material, the second energy-sensitized organic material is 8.0% to 25.0% by mass of the second hole-type organic host material, and the second energy-sensitized organic material is a blue organic fluorescent material with matched energy level and energy; and
a cathode layer disposed on the second light emitting layer.

There are no particular requirements on the substrate in the present disclosure, as long as it is a well-known substrate for those skilled in the art. The substrate is preferably a plastic substrate, a polymer substrate, a silicon-based substrate or a glass substrate, and more preferably a glass substrate.

An anode layer is disposed on the substrate. The anode layer is formed from a material into which holes can be easily injected, preferably a conductive metal, a conductive metal oxide, or graphene, more preferably indium tin oxide, gold electrode, platinum electrode or graphene electrode, and still more preferably indium tin oxide. The indium tin oxide preferably has a surface resistance of 8 to 25 ohm.

According to the present disclosure, an anode interface layer is preferably further disposed on the anode layer. The anode interface layer preferably has a thickness of 2 to 10 nm, more preferably 2 to 8 nm, still more preferably 2 to 5 nm, and the most preferably 3 nm. The anode interface layer is not specifically limited, as long as it is a well-known anode interface layer for those skilled in the art. In the present disclosure, the anode interface layer is preferably molybdenum trioxide, lithium fluoride or sodium chloride.

In order to improve hole transport capability and meanwhile block electron transport so as to reduce the loss of the device and improve the efficiency of the device, a hole transport layer or electron blocking layer is preferably disposed on the anode interface layer. The hole transport layer or electron blocking layer preferably has a thickness of 40 to 60 nm, more preferably 50 to 60 nm, and even more preferably 50 nm. The hole transport layer or electron blocking layer is not specifically limited, as long as it is a well known hole transport layer or electron blocking layer for those skilled in the art. In the present disclosure, the hole transport layer or electron blocking layer is preferably formed from one or more selected from the group consisting of 4,4'-cyclohexylidenebis[N,N-bis(4-methylphenyl)aniline] (TAPC), 4,4'-bis[N-(m-tolyl)-N-phenyl-amino]biphenyl (TPD) and N,N'-di(1-naphtyl)-N,N'-diphenyl-1,1'-biphenyl-4,4'-diamine (NPB), the molecular structural formulae of which are shown as follows:

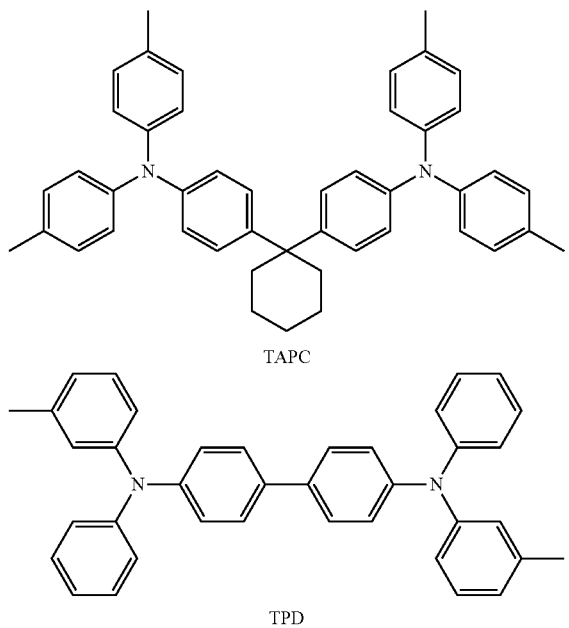

TAPC

TPD

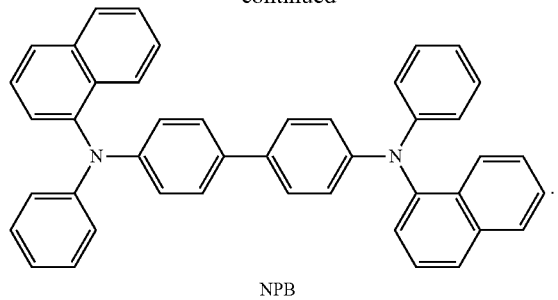

NPB

A first light emitting layer is disposed on the hole transport layer or electron blocking layer. The first light emitting layer is formed from a red organic fluorescent material, a first energy-sensitized organic material and a first hole-type organic host material. The first light emitting layer preferably has a thickness of 5 to 10 nm, and more preferably 7 to 10 nm. The red organic fluorescent material is 0.1% to 1.0%, preferably 0.1% to 0.8%, more preferably 0.1% to 0.5%, and even more preferably 0.1% to 0.2% by mass of the first hole-type organic host material. The red organic fluorescent material is not specifically limited, as long as it is a well-known red organic fluorescent material. In the present application, it is preferably rubrene (with a molecular formula as shown in formula I) and/or 4-dicyanomethylene-2-tert-butyl-6-(1,1,7,7-tetramethyljulolidin-4-yl-vinyl)-4H-pyran (DCJTB, with a molecular formula as shown in formula II). The first energy-sensitized organic material is 8.0% to 25.0%, preferably 10.0% to 25.0%, more preferably 15.0% to 20.0%, and even more preferably 16.0% to 18.0% by mass of the first hole-type organic host material. The first energy-sensitized organic material is a blue organic fluorescent material with matched energy level and energy, and a blue organic fluorescent material well-known in the art can be used without specific limitation, as long as the energy and the energy level thereof are matched. The energy-sensitized organic material with matched energy and energy level can effectively transfer photon energy to a green or red organic fluorescent material, and has excellent electron transport capability. Here, one basic principle for energy matching is that energy can be effectively transferred from the host material to the sensitized material, and then from the sensitized material to the luminescent material, for which it requires that the excited state energy of the host material>the excited state energy of the sensitized material>the excited state energy of the luminescent material. One basic principle for energy level matching is that the host material has a wide energy gap, which can effectively include the energy gap of the luminescent material so as to facilitate capture of carriers. In the present disclosure, the sensitized material should have an energy level favorable for electron injection into the light emitting region, and meanwhile function as an electron-type auxiliary host material. Therefore, in the present disclosure, the first energy-sensitized organic material is preferably 2,2'-(9,10-anthracenediyl-di-4,1-phenylene)bis[6-methyl-benzothiazole] (DBzA, with a molecular formula as shown in formula III). DBzA has high luminescence efficiency and color purity and good thermostability, and meanwhile functions as an energy-sensitized material, so it can effectively transfer photon energy to a red organic luminescent material of rubrene or DCJTB, or a green organic luminescent material of C545T or DMQA. The first hole-type organic host material is not specifically limited, as long as it is a well-known hole-type organic host material for those skilled in the art. In the present disclosure, the first hole-type organic host material is preferably 4,4'-di(9-carbazolyl)biphenyl (CBP, with a molecular formula as shown in formula IV), 1,3-di(carbazol-9-yl)benzene (mCP, with a molecular formula as shown in formula V), 9,9'-(5-(triphenylsilyl)-1,3-phenylene)bis-9H-carbazole (SimCP, with a molecular formula as shown in formula VI), 1,3,5-tri(9-carbazolyl)benzene (TCP, with a molecular formula as shown in formula VII), 4,4',4"-tri(carbazol-9-yl)triphenylamine (TcTa, with a molecular formula as shown in formula VIII) and 4,4'-bis(triphenylsilyl)biphenyl (BSB, with a molecular formula as shown in formula IX).

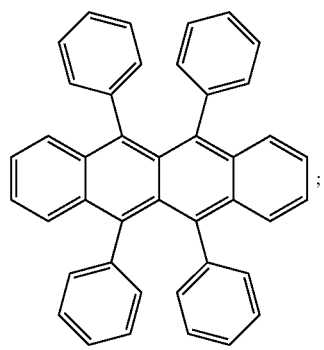

I

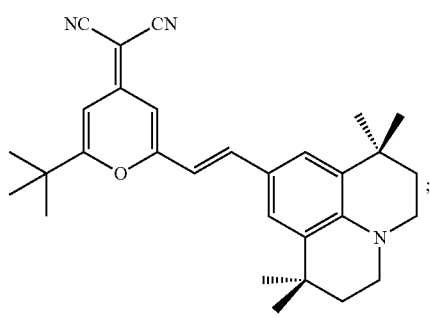

II

DCJTB

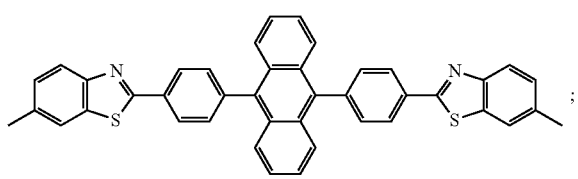

III

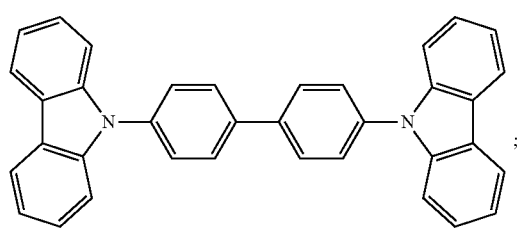

IV

CBP

V

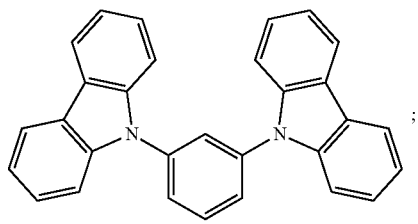

;

VI

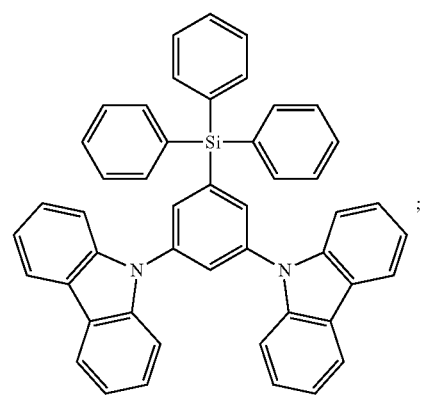

;

VII

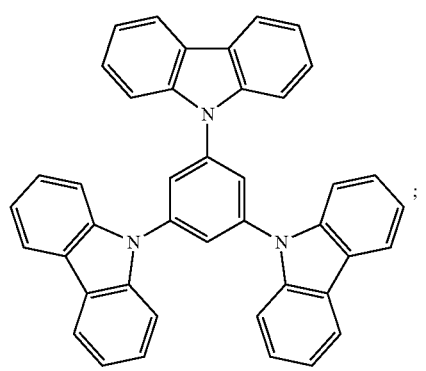

;

VIII

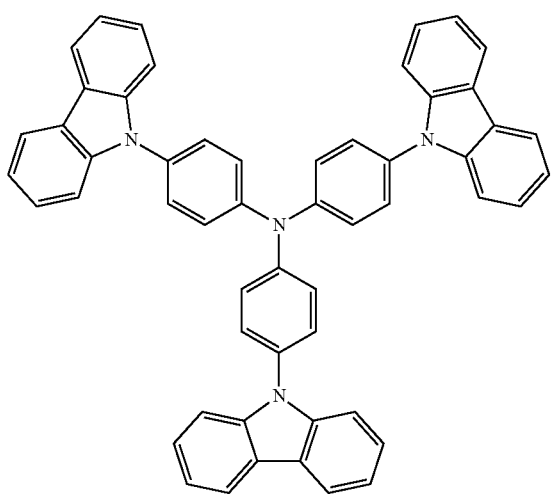

;

IX

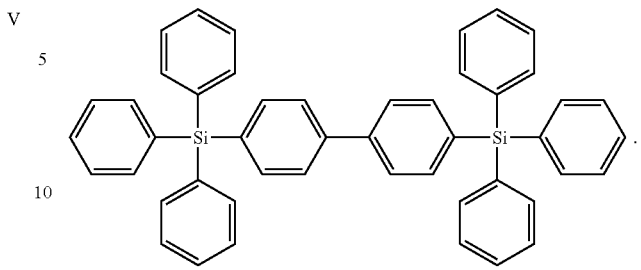

.

A second light emitting layer is disposed on the first light emitting layer. The second light emitting layer preferably has a thickness of 2 to 5 nm, more preferably 2 to 4 nm, and even more preferably 2 to 3 nm. The second light emitting layer is formed from a green organic fluorescent material, a second energy-sensitized organic material and a second hole-type organic host material. The green organic fluorescent material is 0.1% to 2.0%, preferably 0.1% to 1.5%, more preferably 0.1% to 1.0%, even more preferably 0.1% to 0.5%, and the most preferably 0.1% to 0.2% by mass of the second hole-type organic host material. The green organic fluorescent material is not specifically limited, as long as it is a well-known green organic fluorescent material for those skilled in the art. In the present disclosure, the green organic fluorescent material is preferably N,N'-dimethyl-quinacridone (DMQA, with a molecular formula as shown in formula X) and/or 2,3,6,7-tetrahydro-1,1,7,7-tetramethyl-1H,5H,11H-10-(2-benzothiazolyl)-quinolizino[9,9A,1GH] coumarin (C545T, with a molecular formula as shown in formula XI). The second energy-sensitized organic material is 8.0% to 25.0%, preferably 10.0% to 25.0%, more preferably 15.0% to 20.0%, and even more preferably 18.0% to 20.0% by mass of the second hole-type organic host material. The second energy-sensitized organic material is a blue organic fluorescent material with matched energy level and energy. The blue organic fluorescent material is not specifically limited, and a well-known blue organic fluorescent material in the art can be used without specific limitation, as long as the energy and the energy level thereof are matched. In the present disclosure, the blue organic fluorescent material is preferably 2,2'-(9,10-anthracenediyl-di-4,1-phenylene)bis[6-methyl-benzothiazole] (DBzA, with a molecular formula as shown in formula III). The blue organic fluorescent material DBzA has high luminescence efficiency and color purity and good thermostability, and meanwhile functions as an energy-sensitized material, so it can effectively transfer photon energy to a red organic fluorescent material or a green organic fluorescent material. The blue organic fluorescent material DBzA also has an excellent electron transport capability, and is doped at a high concentration, so it may also function as an electron-type host material, capable of effectively balancing the distribution of carriers in the light emitting layer. The second hole-type organic host material is not specifically limited, as long as it is a well-known hole-type organic host material for those skilled in the art. In the present disclosure, the second hole-type organic host material is preferably 4,4'-di(9-carbazolyl)biphenyl (CBP, with a molecular formula as shown in formula IV), 1,3-di(carbazol-9-yl)benzene (mCP, with a molecular formula as shown in formula V), 9,9'-(5-(triphenylsilyl)-1,3-phenylene)bis-9H-carbazole (SimCP, with a molecular formula as shown in formula VI), 1,3,5-tri(9-carbazolyl)benzene (TCP, with a molecular formula as shown in formula VII), 4,4',4''-tri(carbazol-9-yl)triphenylamine (TcTa, with a molecular formula as shown in formula VIII) and 4,4'-bis(triphenylsilyl)biphenyl (BSB, with a molecular formula as shown in formula IX).

X

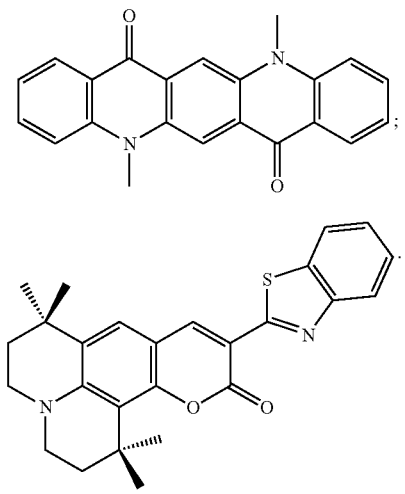

XI

XIII

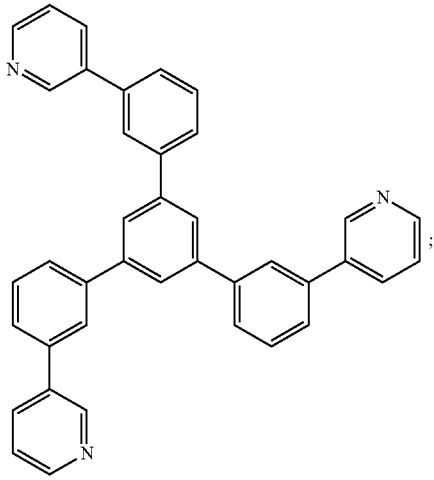

In order to improve electron transport capability and meanwhile block hole transport so as to reduce the loss of the device and improve the efficiency of the device, a hole blocking layer or electron transport layer is preferably further disposed on the second light emitting layer. The hole blocking layer or electron transport layer preferably has a thickness of 40 to 60 nm, more preferably 45 to 55 nm, and still more preferably 50 nm. The hole blocking layer or electron transport layer is not specifically limited, as long as it is a well-known hole blocking layer or electron transport layer for those skilled in the art. In the present disclosure, the hole blocking layer or electron transport layer is preferably formed from one or more selected from the group consisting of tris[2,4,6-trimethyl-3-(3-pyridyl)phenyl]borane (3TP-YMB), 1,3,5-tri[(3-pyridyl)-3-phenyl]benzene (TmPyPB), 1,3-bis[3,5-di(3-pyridyl)phenyl]benzene (BmPyPhB), 1,3,5-tris(1-phenyl-1H-benzoimidazol-2-yl)benzene (TPBi) and 1,3,5-tris{6-[3-(pyridin-3-yl)phenyl]pyridin-2-yl}benzene (Tm3PyP26PyB), the molecular formulae of which are as shown in formulae XII, XIII, XIV, XV and XVI.

XIV

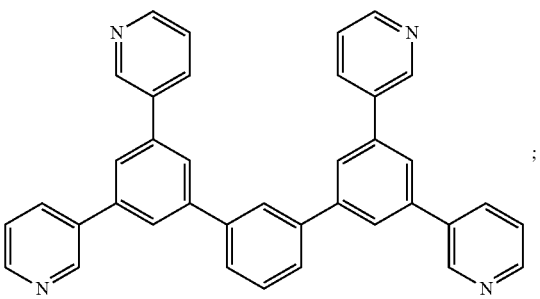

XII

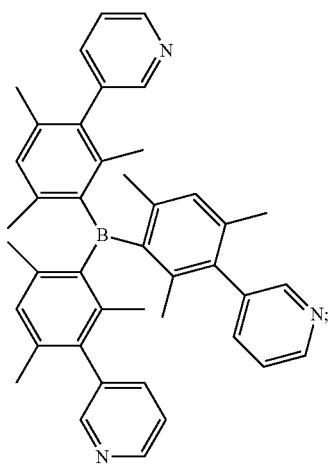

XV

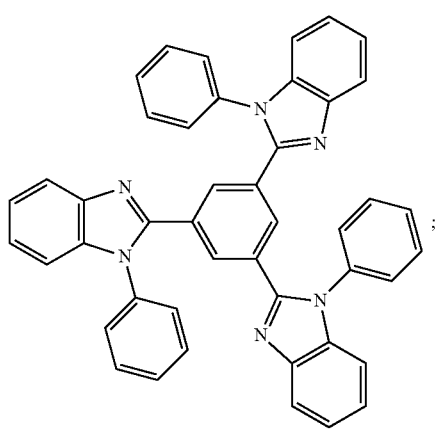

-continued

XVI

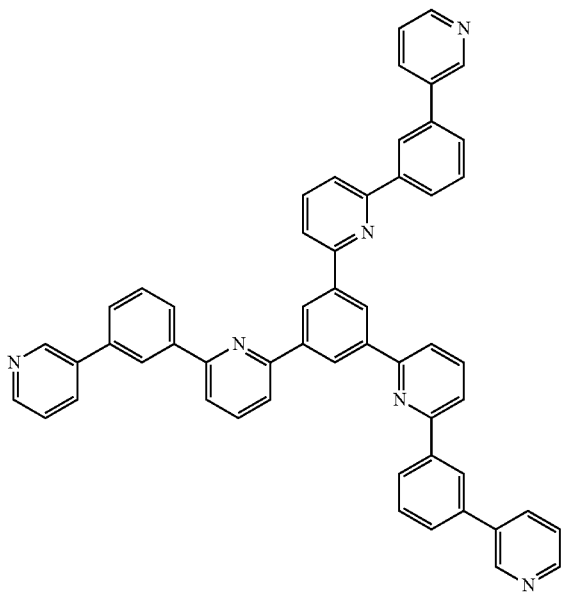

In order to increase the electron injection efficiency to further improve the efficiency of the device, a buffer layer is preferably further disposed on the hole blocking layer or electron transport layer. The buffer layer preferably has a thickness of 0.8 to 1.2 nm, more preferably 0.9 to 1.1 nm, and still more preferably 1 nm. The buffer layer is not specifically limited, as long as it is a well-known buffer layer for those skilled in the art. In the present disclosure, the buffer layer is preferably formed from lithium fluoride, sodium chloride or sodium carbonate.

A cathode layer is disposed on the buffer layer. The cathode layer preferably has a thickness of 90 to 150 nm, more preferably 100 to 140 nm, still more preferably 110 to 130 nm, and the most preferably 120 nm. The cathode layer is not specifically limited, as long as it is a well-known cathode layer for those skilled in the art. In the present disclosure, the cathode layer is preferably formed from metal aluminum, magnesium silver alloy or silver.

A schematic structural diagram of the white organic electroluminescent device provided in the present disclosure is as shown in FIG. 1, wherein 1 represents a substrate, 2 represents an anode layer, 3 represents an anode interface layer, 4 represents a hole transport layer/electron blocking layer, 5 represents a first light emitting layer, 6 represents a second light emitting layer, 7 represents a hole blocking layer/electron transport layer, 8 represents a buffer layer, and 9 represents a cathode layer. The anode and the cathode of the white organic electroluminescent device are overlapped with each other to form a light emitting region. When a positive voltage is applied between these two electrodes, the device will emit a white light covering 410 to 650 nm.

A blue organic fluorescent material is used as luminescent material and energy-sensitized material in the present disclosure, which can effectively transfer photon energy to a red organic fluorescent material or a green organic fluorescent material. Meanwhile, the blue organic fluorescent material also has excellent electron transport capability, and as it is doped in the light emitting layer at a high concentration, the blue organic fluorescent material can function as an electron-type host material, which is beneficial for balancing the distribution of holes and electrons in the light emitting region, can confine the recombination of holes and electrons within the narrow region of the light emitting layer, and can effectively balance the distribution of carriers in the light emitting layer. In addition, the device provided in the present disclosure has simple structure and low cost, and all materials thereof have good thermostability, which is beneficial for improving the lifetime of the device.

The present disclosure further provides a preparation method of the above-mentioned white organic electroluminescent device, comprising the following steps:

forming an anode layer on a substrate;

forming a first light emitting layer on the anode layer, the first light emitting layer being formed from a red organic fluorescent material, a first energy-sensitized organic material and a first hole-type organic host material, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a blue organic fluorescent material with matched energy level and energy;

forming a second light emitting layer on the first light emitting layer, the second light emitting layer being formed from a green organic fluorescent material, a second energy-sensitized organic material and a second hole-type organic host material, wherein the green organic fluorescent material is 0.2% to 2.0% by mass of the second hole-type organic host material, the second energy-sensitized organic material is 8.0% to 25.0% by mass of the second hole-type organic host material, and the second energy-sensitized organic material is a blue organic fluorescent material with matched energy level and energy; and forming a cathode on the second light emitting layer, thereby obtaining the white organic electroluminescent device.

According to the present disclosure, an anode layer is firstly formed on a substrate. The substrate and the anode layer are as described above, and will not be reiterated here. In the present disclosure, the electrode is preferably obtained by etching the conductive metal, conductive metal oxide, or graphene on the substrate. The shape and size of the electrode formed by etching are not specifically limited in the present disclosure. For example, a strip electrode with a width of 10 mm and a length of 30 mm may be formed by etching.

Then, an anode interface layer is preferably formed on the anode layer. The anode interface layer is as described above and will not be reiterated here. In the present disclosure, preferably, the substrate with the anode layer formed thereon is washed and dried, and then the anode interface layer is formed on the anode layer. The process for forming the anode interface layer is not specifically limited, as long as it is a well-known process for those skilled in the art. In the present disclosure, preferably, the dried substrate with the anode layer formed is firstly subjected to a low pressure oxygen plasma treatment under vacuum condition, and then the anode interface layer is vapor deposited thereon. The vacuum degree for the vacuum condition is preferably 8 to 15 Pa. The voltage for the low pressure oxygen plasma treatment is 350 to 500 V. The time for the low pressure oxygen plasma treatment is preferably 5 to 15 min. The vacuum degree for the vapor deposition is preferably $5\times10^{-5}$ to $8\times10^{-5}$ Pa.

Then, a hole transport layer or electron blocking layer is preferably formed on the anode interface layer. The hole transport layer or electron blocking layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1 \times 10^{-5}$ to $3 \times 10^{-5}$ Pa. The evaporation rate of organic material in the vacuum vapor deposition is preferably 0.05 to 0.1 nm/s.

Then, a first light emitting layer is formed on the hole transport layer or electron blocking layer. The first light emitting layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1 \times 10^{-5}$ to $3 \times 10^{-5}$ Pa. In the vacuum vapor deposition, the evaporation rate of the red organic fluorescent material is preferably 0.00005 to 0.001 nm/s; the evaporation rate of the first energy-sensitized organic material is preferably 0.004 to 0.025 nm/s; and the evaporation rate of the first hole-type organic host material is preferably 0.05 to 0.1 nm/s. The red organic fluorescent material, the first energy-sensitized organic material and the first hole-type organic host material in the mixed organic material are evaporated simultaneously from different evaporation sources. The evaporation rates of these three materials are adjusted such that the red organic fluorescent material is 0.1% to 1.0% by mass of the first hole-type organic host material, and the first energy-sensitized organic material is 8.0% to 25.0% by mass of the first hole-type organic host material.

A second light emitting layer is formed on the first light emitting layer. The second light emitting layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1 \times 10^{-5}$ to $3 \times 10^{-5}$ Pa. In the vacuum vapor deposition, the evaporation rate of the green organic fluorescent material is preferably 0.0001 to 0.002 nm/s.; the evaporation rate of the second energy-sensitized organic material is preferably 0.004 to 0.025 nm/s; and the evaporation rate of the second hole-type organic host material is preferably 0.05 to 0.1 nm/s. The green organic fluorescent material, the second energy-sensitized organic material and the second hole-type organic host material in the mixed organic material are evaporated simultaneously from different evaporation sources. The evaporation rates of these three materials are adjusted such that the green organic fluorescent material is 0.1% to 2.0% by mass of the second hole-type organic host material, and the second energy-sensitized organic material is 8.0% to 25.0% by mass of the second hole-type organic host material.

According to the present disclosure, a hole blocking layer or electron transport layer is preferably formed on the second light emitting layer. The hole blocking layer or electron transport layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1 \times 10^{-5}$ to $3 \times 10^{-5}$ Pa. The evaporation rate of organic material in the vacuum vapor deposition is preferably 0.05 to 0.1 nm/s.

Then, a buffer layer is preferably formed on the hole blocking layer or electron transport layer. The buffer layer is as described above and will not be reiterated here. The forming process is not specifically limited, as long as it is a well-known process for those skilled in the art. In the present disclosure, the process is preferably a vacuum vapor deposition process. The vacuum degree for the vacuum vapor deposition is preferably $5 \times 10^{-5}$ to $8 \times 10^{-5}$ Pa. The evaporation rate is preferably 0.5 to 1.5 nm/s.

Finally, a cathode layer is formed on the buffer layer, thereby obtaining a white organic electroluminescent device. The cathode layer is as described above, and will not be reiterated here. The forming process is not specifically limited, as long as it is a well-known process for those skilled in the art. In the present disclosure, the process is preferably a vacuum vapor deposition process. The vacuum degree for the vacuum vapor deposition is preferably $5 \times 10^{-5}$ to $8 \times 10^{-5}$ Pa.

The white organic electroluminescent device provided in the present disclosure has a simple structure, which is favorable for simplifying the preparation process of the device. Meanwhile, various functional materials used generally have relatively low prices, which is favorable for lowering the manufacture cost of the device. In addition, all the materials used have good thermostability, which is favorable for improving the device lifetime.

By optimizing the device structure design and simplifying the device structure and the preparation process, the present disclosure improves the efficiency, luminance and operation stability of the device and reduces the manufacture cost of the device, on the premise that it is ensured that the spectral stability of the device is not reduced.

In order to further illustrate the present disclosure, the white organic electroluminescent device and the preparation method thereof provided in the present disclosure will be described in detail below with reference to examples.

All reagents used in the following examples are commercially available.

Example 1

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm MoO$_3$ anode interface layer 3 under a vacuum atmosphere of $3 \times 10^{-5}$ to $5 \times 10^{-5}$ Pa. Then, the uncompleted device was transferred to an organic vapor deposition chamber to sequentially vapor deposit a TAPC hole transport layer/electron blocking layer 4 with a thickness of 50 nm, a DCJTB and DBzA doped TcTa first light emitting layer 5 with a thickness of 8 nm, a C545T and DBzA doped TcTa second light emitting layer 6 with a thickness of 2 nm, and a Tm3PyP26PyB hole blocking layer/electron transport layer 7 with a thickness of 50 nm on the anode interface layer 3 under a vacuum atmosphere having a vacuum degree of $1 \times 10^{-5}$ to $3 \times 10^{-5}$ Pa. Next, the uncompleted device was transferred to a metal vapor deposition chamber to vapor deposit a LiF buffer layer with a thickness of 1.0 nm under a vacuum atmosphere of $3 \times 10^{-5}$ to $5 \times 10^{-5}$ Pa. Finally, a metal Al electrode with a thickness of 120 nm was vapor deposited on the LiF layer through a specially-made mask plate to prepare a white organic electroluminescent device having a structure of ITO/MoO$_3$/TAPC/DCJTB (0.1%):

DBzA (16 wt %):TcTa/C545T (0.2%):DBzA (20 wt %):TcTa/Tm3PyP26PyB/LiF/Al. The evaporation rates for DCJTB, DBzA and TcTa in the first light emitting layer 5 were controlled at 0.00005 nm/s, 0.008 nm/s and 0.05 nm/s, respectively. The evaporation rates for C545T, DBzA and TcTa in the second light emitting layer 6 were controlled at 0.0001 nm/s, 0.01 nm/s and 0.05 nm/s, respectively. The evaporation rates for TAPC and Tm3PyP26PyB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The white organic electroluminescent device obtained in Example 1 exhibited a white light emission covering a range from 410 nm to 650 nm under a direct voltage driving. As the operation voltage varied, the color coordinate of the device was stabilized in a range of from (0.307, 0.316) to (0.425, 0.454). When the luminance was 1000 $cd/m^2$, the color coordinate of the device was (0.366, 0.413).

Figure 2:
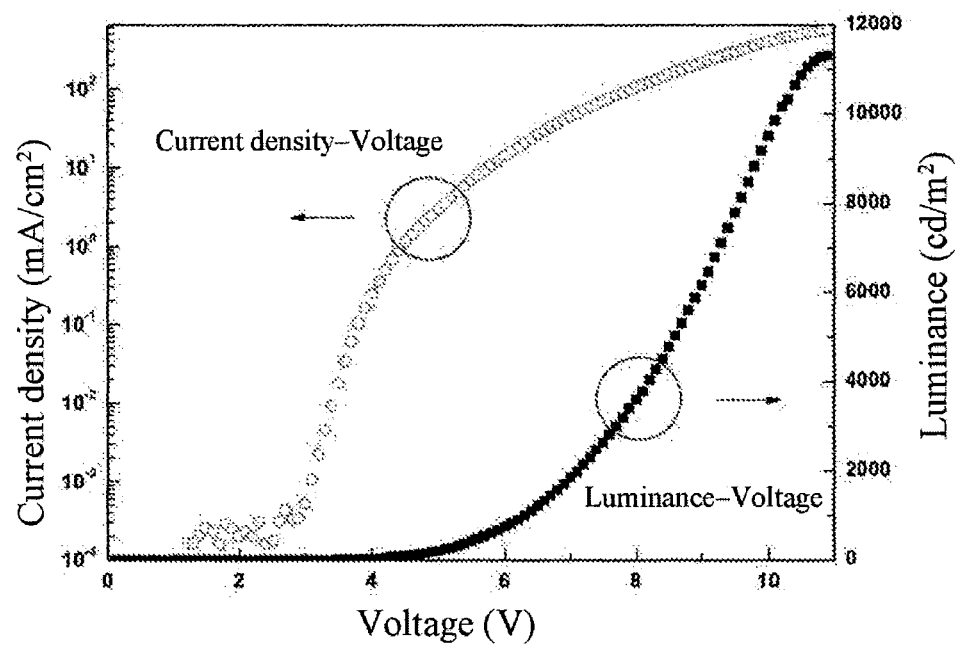
FIG. 2 shows the characteristic curves of voltage-current density-luminance of the white organic electroluminescent device obtained in Example 1 of the present disclosure. The luminance of the device increases as the current density and the driving voltage increase. The lighting-up voltage of the device is 3.3 volts (V). The maximal luminance of 11315 candelas per square meter (cd/m²) is obtained when the voltage is 10.9 V and the current density is 557.86 milliamperes per square centimeter (mA/cm²).

FIG. 2 shows the characteristic curves of voltage-current density-luminance of the white organic electroluminescent device obtained in Example 1. As seen from FIG. 2, the lighting-up voltage of the device was 3.3 V, and when the voltage was 10.9 V and the current density was 557.86 $mA/m^2$, the maximal luminance of the device was 11315 $cd/m^2$.

Figure 3:
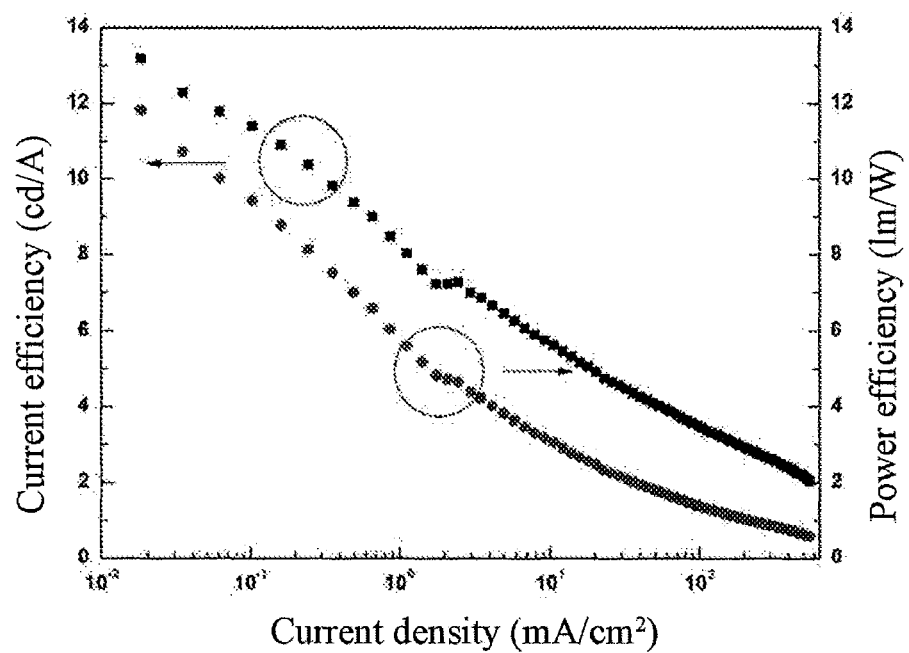
FIG. 3 shows the characteristic curves of current density-power efficiency-current efficiency of the white organic electroluminescent device obtained in Example 1 of the present disclosure. The maximal current efficiency of the device is 13.17 cd/A, and the maximal power efficiency is 11.82 lm/W.

FIG. 3 shows the characteristic curves of current density-power efficiency-current efficiency of the white organic electroluminescent device obtained in Example 1. As seen from FIG. 3, the maximal current efficiency of the device was 13.17 cd/A, and the maximal power efficiency was 11.82 lm/W.

Figure 4:
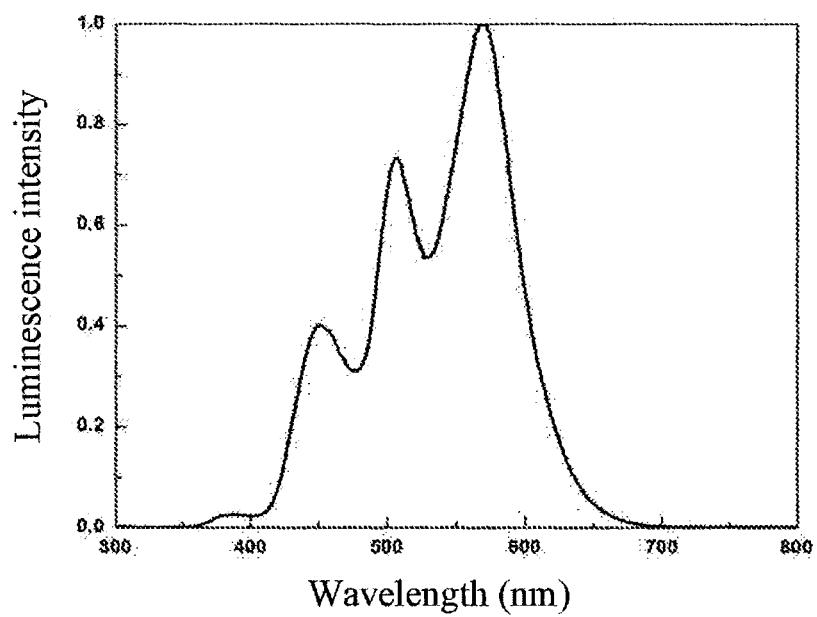
FIG. 4 shows a spectrum of the white organic electroluminescent device obtained in Example 1 of the present disclosure when the luminance is 1000 cd/m². The color coordinate of the device is (0.366, 0.413).

FIG. 4 shows a spectrum of the white organic electroluminescent device obtained in Example 1 when the luminance is 1000 $cd/m^2$. As seen from FIG. 4, the color coordinate of the device was (0.366, 0.413).

Example 2

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3 \times 10^{-5}$ to $5 \times 10^{-5}$ Pa. Then, the uncompleted device was transferred to an organic vapor deposition chamber to sequentially vapor deposit a TAPC hole transport layer/electron blocking layer 4 with a thickness of 50 nm, a DCJTB and DBzA doped TcTa first light emitting layer 5 with a thickness of 7 nm, a C545T and DBzA doped TcTa second light emitting layer 6 with a thickness of 3 nm, and a Tm3PyP26PyB hole blocking layer/electron transport layer 7 with a thickness of 50 nm on the anode interface layer 3 under a vacuum atmosphere having a vacuum degree of $1 \times 10^{-5}$ to $3 \times 10^{-5}$ Pa. Next, the uncompleted device was transferred to a metal vapor deposition chamber to vapor deposit a LiF buffer layer with a thickness of 1.0 nm under a vacuum atmosphere of $3 \times 10^{-5}$ to $5 \times 10^{-5}$ Pa. Finally, a metal Al electrode with a thickness of 120 nm was vapor deposited on the LiF layer through a specially-made mask plate to prepare a white organic electroluminescent device having a structure of ITO/$MoO_3$/TAPC/DCJTB (0.2%): DBzA (16 wt %):TcTa/C545T (0.1%):DBzA (20 wt %):TcTa/Tm3PyP26PyB/LiF/Al. The evaporation rates for DCJTB, DBzA and TcTa in the first light emitting layer 5 were controlled at 0.00005 nm/s, 0.008 nm/s and 0.05 nm/s, respectively. The evaporation rates for C545T, DBzA and TcTa in the second light emitting layer 6 were controlled at 0.00005 nm/s, 0.01 nm/s and 0.05 nm/s, respectively. The evaporation rates for TAPC and Tm3PyP26PyB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The white organic electroluminescent device obtained in Example 2 exhibited a white light emission covering a range from 410 nm to 650 nm under a direct voltage driving. As the operation voltage varied, the color coordinate of the device was stabilized in a range of from (0.285, 0.301) to (0.409, 0.413). When the luminance was 1000 $cd/m^2$, the color coordinate of the device was (0.323, 0.365).

Figure 5:
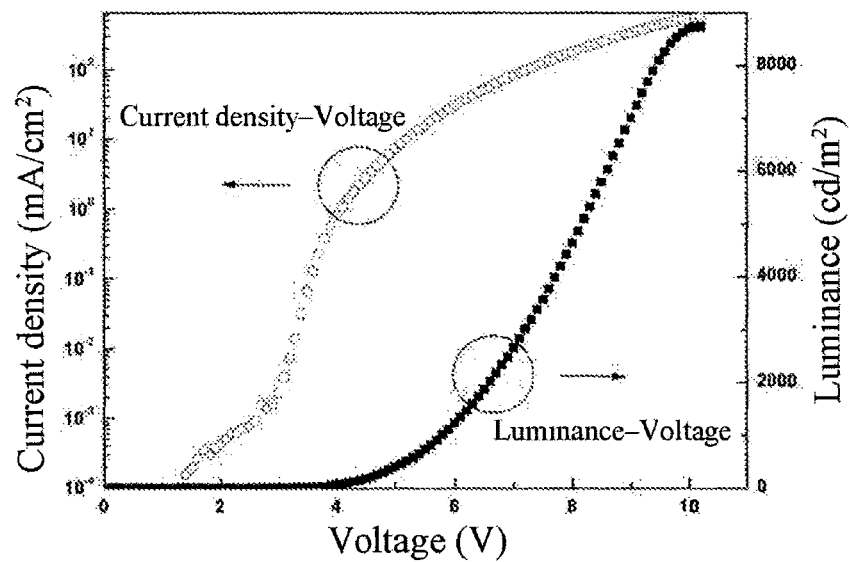
FIG. 5 shows the characteristic curves of voltage-current density-luminance of the white organic electroluminescent device obtained in Example 2 of the present disclosure. The luminance of the device increases as the current density and the driving voltage increase. The lighting-up voltage of the device is 3.2 V. The maximal luminance of 8738 cd/m² is obtained when the voltage is 10.2 V and the current density is 559.44 mA/cm².

FIG. 5 shows the characteristic curves of voltage-current density-luminance of the white organic electroluminescent device obtained in Example 2. As seen from FIG. 5, the luminance of the device increased as the current density and the driving voltage increased. The lighting-up voltage of the device was 3.2 V, and when the voltage was 10.2 V and the current density was 559.44 $mA/m^2$, the maximal luminance of the device was 8738 $cd/m^2$.

Figure 6:
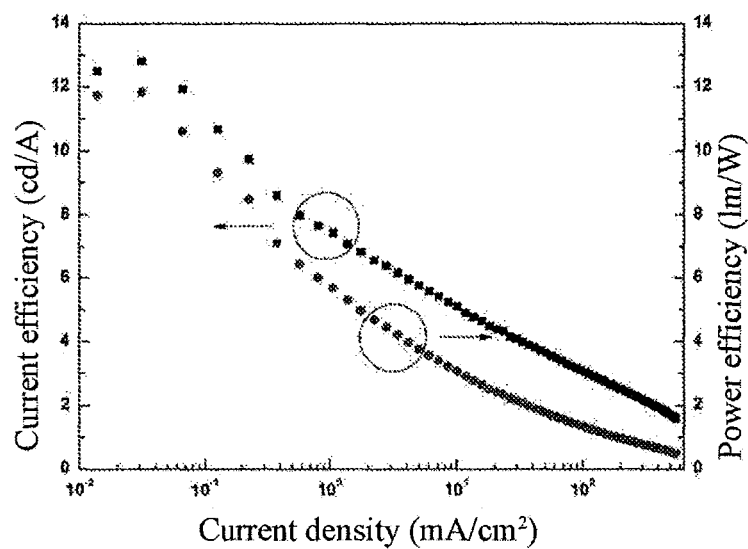
FIG. 6 shows the characteristic curves of current density-power efficiency-current efficiency of the white organic electroluminescent device obtained in Example 2 of the present disclosure. The maximal current efficiency of the device is 12.80 cd/A, and the maximal power efficiency is 11.80 lm/W.

FIG. 6 shows the characteristic curves of current density-power efficiency-current efficiency of the white organic electroluminescent device obtained in Example 2. As seen from FIG. 6, the maximal current efficiency of the device was 12.80 cd/A, and the maximal power efficiency was 11.80 lm/W.

Example 3

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3 \times 10^{-5}$ to $5 \times 10^{-5}$ Pa. Then, the uncompleted device was transferred to an organic vapor deposition chamber to sequentially vapor deposit a TAPC hole transport layer/electron blocking layer 4 with a thickness of 50 nm, a DCJTB and DBzA doped TcTa first light emitting layer 5 with a thickness of 8 nm, a C545T and DBzA doped TcTa second light emitting layer 6 with a thickness of 2 nm, and a Tm3PyP26PyB hole blocking layer/electron transport layer 7 with a thickness of 50 nm on the anode interface layer 3 under a vacuum atmosphere having a vacuum degree of $1 \times 10$ to $3 \times 10^{-5}$ Pa. Next, the uncompleted device was transferred to a metal vapor deposition chamber to vapor deposit a LiF buffer layer with a thickness of 1.0 nm under a vacuum atmosphere of $3 \times 10^{-5}$ to $5 \times 10^{-5}$ Pa. Finally, a metal Al electrode with a thickness of 120 nm was vapor deposited on the LiF layer through a specially-made mask plate to prepare a white organic electroluminescent device having a structure of ITO/$MoO_3$/TAPC/DCJTB (0.1%): DBzA (18 wt %):TcTa/C545T (0.2%):DBzA (18 wt %):TcTa/Tm3PyP26PyB/LiF/Al. The evaporation rates for DCJTB, DBzA and TcTa in the first light emitting layer 5 were controlled at 0.00005 nm/s, 0.009 nm/s and 0.05 nm/s, respectively. The evaporation rates for C545T, DBzA and TcTa in the second light emitting layer 6 were controlled at 0.0001 nm/s, 0.009 nm/s and 0.05 nm/s, respectively. The evaporation rates for TAPC and Tm3PyP26PyB were controlled at 0.05 nm/s. The evaporation rate for MoO$_3$ was controlled at 0.01 nm/s. The evaporation rate for LiF was controlled at 0.005 nm/s. The evaporation rate for Al was controlled at 0.5 nm/s.

The white organic electroluminescent device obtained in Example 3 exhibited a white light emission covering a range from 410 nm to 650 nm under a direct voltage driving. As the operation voltage varied, the color coordinate of the device was stabilized in a range of from (0.303, 0.319) to (0.432, 0.461). When the luminance was 1000 cd/m$^2$, the color coordinate of the device was (0.358, 0.411). The lighting-up voltage of the device was 3.3 V, and the maximal luminance of the device was 11002 cd/m$^2$. The maximal current efficiency of the device was 12.27 cd/A, and the maximal power efficiency was 11.16 lm/W.

Example 4

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm MoO$_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/ electron blocking layer 4 with a thickness of 50 nm, a DCJTB and DBzA doped TcTa first light emitting layer 5 with a thickness of 10 nm, a C545T and DBzA doped TcTa second light emitting layer 6 with a thickness of 2 nm, and a Tm3PyP26PyB hole blocking layer/electron transport layer 7 with a thickness of 50 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a white organic electroluminescent device having a structure of ITO/MoO$_3$/TAPC/DCJTB (0.1%): DBzA (16 wt %):TcTa/C545T (0.2%):DBzA (20 wt %):TcTa/Tm3PyP26PyB/LiF/Al. The evaporation rates for DCJTB, DBzA and TcTa in the first light emitting layer 5 were controlled at 0.00005 nm/s, 0.008 nm/s and 0.05 nm/s, respectively. The evaporation rates for C545T, DBzA and TcTa in the second light emitting layer 6 were controlled at 0.0001 nm/s, 0.01 nm/s and 0.05 nm/s, respectively. The evaporation rates for TAPC and Tm3PyP26PyB were controlled at 0.05 nm/s. The evaporation rate for MoO$_3$ was controlled at 0.01 nm/s. The evaporation rate for LiF was controlled at 0.005 nm/s. The evaporation rate for Al was controlled at 0.5 nm/s.

The white organic electroluminescent device obtained in Example 4 exhibited a white light emission covering a range from 410 nm to 650 nm under a direct voltage driving. As the operation voltage varied, the color coordinate of the device was stabilized in a range of from (0.315, 0.322) to (0.440, 0.462). When the luminance was 1000 cd/m$^2$, the color coordinate of the device was (0.369, 0.421). The lighting-up voltage of the device was 3.3 V, and the maximal luminance of the device was 11996 cd/m$^2$. The maximal current efficiency of the device was 13.35 cd/A, and the maximal power efficiency was 12.17 lm/W.

Example 5

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm MoO$_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/ electron blocking layer 4 with a thickness of 50 nm, a DCJTB and DBzA doped TcTa first light emitting layer 5 with a thickness of 8 nm, a C545T and DBzA doped TcTa second light emitting layer 6 with a thickness of 3 nm, and a Tm3PyP26PyB hole blocking layer/electron transport layer 7 with a thickness of 50 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a white organic electroluminescent device having a structure of ITO/MoO$_3$/TAPC/DCJTB (0.1%): DBzA (18 wt %):TcTa/C545T (0.2%):DBzA (18 wt %):TcTa/Tm3PyP26PyB/LiF/Al. The evaporation rates for DCJTB, DBzA and TcTa in the first light emitting layer 5 were controlled at 0.00005 nm/s, 0.009 nm/s and 0.05 nm/s, respectively. The evaporation rates for C545T, DBzA and TcTa in the second light emitting layer 6 were controlled at 0.0001 nm/s, 0.009 nm/s and 0.05 nm/s, respectively. The evaporation rates for TAPC and Tm3PyP26PyB were controlled at 0.05 nm/s. The evaporation rate for MoO$_3$ was controlled at 0.01 nm/s. The evaporation rate for LiF was controlled at 0.005 nm/s. The evaporation rate for Al was controlled at 0.5 nm/s.

The white organic electroluminescent device obtained in Example 5 exhibited a white light emission covering a range from 410 nm to 650 nm under a direct voltage driving. As the operation voltage varied, the color coordinate of the device was stabilized in a range of from (0.311, 0.318) to (0.433, 0.465). When the luminance was 1000 cd/m$^2$, the color coordinate of the device was (0.349, 0.421). The lighting-up voltage of the device was 3.2 V, and the maximal luminance of the device was 12618 cd/m$^2$. The maximal current efficiency of the device was 12.78 cd/A, and the maximal power efficiency was 11.45 lm/W.

Example 6

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm MoO$_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/electron blocking layer 4 with a thickness of 50 nm, a DCJTB and DBzA doped TcTa first light emitting layer 5 with a thickness of 10 nm, a C545T and DBzA doped TcTa second light emitting layer 6 with a thickness of 2 nm, and a Tm3PyP26PyB hole blocking layer/electron transport layer 7 with a thickness of 50 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a white organic electroluminescent device having a structure of ITO/MoO$_3$/TAPC/DCJTB (0.1%): DBzA (18 wt %):TcTa/C545T (0.2%):DBzA (20 wt %):TcTa/Tm3PyP26PyB/LiF/Al. The evaporation rates for DCJTB, DBzA and TcTa in the first light emitting layer 5 were controlled at 0.00005 nm/s, 0.008 nm/s and 0.05 nm/s, respectively. The evaporation rates for C545T, DBzA and TcTa in the second light emitting layer 6 were controlled at 0.0001 nm/s, 0.01 nm/s and 0.05 nm/s, respectively. The evaporation rates for TAPC and Tm3PyP26PyB were controlled at 0.05 nm/s. The evaporation rate for MoO$_3$ was controlled at 0.01 nm/s. The evaporation rate for LiF was controlled at 0.005 nm/s. The evaporation rate for Al was controlled at 0.5 nm/s.

The white organic electroluminescent device obtained in Example 6 exhibited a white light emission covering a range from 410 nm to 650 nm under a direct voltage driving. As the operation voltage varied, the color coordinate of the device was stabilized in a range of from (0.316, 0.334) to (0.455, 0.465). When the luminance was 1000 cd/m$^2$, the color coordinate of the device was (0.377, 0.432). The lighting-up voltage of the device was 3.3 V, and the maximal luminance of the device was 12963 cd/m$^2$. The maximal current efficiency of the device was 13.02 cd/A, and the maximal power efficiency was 11.70 lm/W.

What is claimed is:

1. A white organic electroluminescent device, comprising:
   a substrate;
   an anode layer disposed on the substrate;
   a first light emitting layer consisting of a red organic fluorescent material as a luminescent material, a first energy-sensitized organic material and a first hole-type organic host material disposed on the anode layer, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a first blue organic fluorescent material with matched energy level and energy;
   a second light emitting layer consisting of a green organic fluorescent material as a luminescent material, a second energy-sensitized organic material and a second hole-type organic host material disposed on the first light emitting layer, wherein the green organic fluorescent material is 0.1% to 2.0% by mass of the second hole-type organic host material, the second energy-sensitized organic material is 8.0% to 25.0% by mass of the second hole-type organic host material, and the second energy-sensitized organic material is a second blue organic fluorescent material with matched energy level and energy; and
   a cathode layer disposed on the second light emitting layer,
   wherein an excited state energy of the first hole-type organic host material>an excited state energy of the first energy-sensitized organic material>an excited state energy of the red organic fluorescent material, and the first hole-type organic host material has a wide energy gap which includes an energy gap of the red organic fluorescent material,
   wherein an excited state energy of the second hole-type organic host material>an excited state energy of the second energy-sensitized organic material>an excited state energy of the green organic fluorescent material, and the second hole-type organic host material has a wide energy gap which includes an energy gap of the green organic fluorescent material, and
   wherein the first and second energy-sensitized organic materials are each 2,2'-(9,10-anthracenediyl-di-4,1-phenylene)bis[6-methyl-benzothiazole] (DBzA).

2. The white organic electroluminescent device according to claim 1, wherein the red organic fluorescent material is rubrene and/or 4-dicyanomethylene-2-tert-butyl-6-(1,1,7,7-tetramethyljulolidin-4-yl-vinyl)-4H-pyran.

3. The white organic electroluminescent device according to claim 1, wherein the green organic fluorescent material is N,N'-dimethyl-quinacridone and/or 2,3,6,7-tetrahydro-1,1, 7,7-tetramethyl-1H,5H,11H-10-(2-benzothiazolyl)-quinolizino[9,9A,1GH]coumarin.

4. The white organic electroluminescent device according to claim 1, wherein the first and second hole-type organic host materials are each independently one or more selected from the group consisting of 4,4'-di(9-carbazolyl)biphenyl, 1,3-di(carbazol-9-yl)benzene, 9,9'-(5-(triphenylsilyl)-1,3-phenylene)bis-9H-carbazole, 1,3,5-tri(9-carbazolyl)benzene, 4,4',4"tri(carbazol-9-yl)triphenylamine and 4,4'-bis (triphenylsilyl)biphenyl.

5. The white organic electroluminescent device according to claim 1, wherein the first light emitting layer has a thickness of from 5 to 10 nm, and the second light emitting layer has a thickness of from 2 to 5 nm.

6. The white organic electroluminescent device according to claim 1, further comprising an anode interface layer between the anode layer and the first light emitting layer, wherein the anode interface layer has a thickness of from 2 to 10 nm.

7. The white organic electroluminescent device according to claim 1, further comprising a hole transport layer or electron blocking layer between the anode layer and the first light emitting layer, wherein the hole transport layer or electron blocking layer has a thickness of from 40 to 60 nm.

8. The white organic electroluminescent device according to claim 1, further comprising a hole blocking layer or electron transport layer between the second light emitting layer and the cathode layer, wherein the hole blocking layer or electron transport layer has a thickness of from 40 to 60 nm.

9. The white organic electroluminescent device according to claim 8, further comprising a buffer layer between the hole blocking layer or electron transport layer and the cathode layer, wherein the buffer layer has a thickness of from 0.8 to 1.2 nm.

10. A preparation method of a white organic electroluminescent device, comprising the steps of:

forming an anode layer on a substrate;

forming a first light emitting layer on the anode layer, the first light emitting layer consisting of a red organic fluorescent material, a first energy-sensitized organic material and a first hole-type organic host material, wherein the red organic fluorescent material is 0.1% to 1.0% by mass of the first hole-type organic host material, the first energy-sensitized organic material is 8.0% to 25.0% by mass of the first hole-type organic host material, and the first energy-sensitized organic material is a first blue organic fluorescent material with matched energy level and energy;

forming a second light emitting layer on the first light emitting layer, the second light emitting layer consisting of a green organic fluorescent material, a second energy-sensitized organic material and a second hole-type organic host material, wherein the green organic fluorescent material is 0.2% to 2.0% by mass of the second hole-type organic host material, the second energy-sensitized organic material is 8.0% to 25.0% by mass of the second hole-type organic host material, and the second energy-sensitized organic material is a second blue organic fluorescent material with matched energy level and energy; and forming a cathode on the second light emitting layer, thereby obtaining the white organic electroluminescent device, wherein an excited state energy of the first hole-type organic host material>an excited state energy of the first energy-sensitized organic material>an excited state energy of the red organic fluorescent material, and the first hole-type organic host material has a wide energy gap which includes an energy gap of the red organic fluorescent material, wherein an excited state energy of the second hole-type organic host material>an excited state energy of the second energy-sensitized organic material>an excited state energy of the green organic fluorescent material, and the second hole-type organic host material has a wide energy gap which includes an energy gap of the green organic fluorescent material, and wherein the first and second energy-sensitized organic materials are each 2,2'-(9,10-anthracenediyl-di-4,1-phenylene)bis[6-methyl-benzothiazole] (DBzA).

11. The preparation method according to claim 10, wherein the red organic fluorescent material is rubrene and/or 4-dicyanomethylene-2-tert-butyl-6-(1,1,7,7-tetramethyljulolidin-4-yl-vinyl)-4H-pyran.

12. The preparation method according to claim 10, wherein the green organic fluorescent material is N,N'-dimethyl-quinacridone and/or 2,3,6,7-tetrahydro-1,1,7,7-tetramethyl-1H,5H,11H-10-(2-benzothiazolyl)-quinolizino[9,9A,1GH]coumarin.

13. The preparation method according to claim 10, wherein, the first and second hole-type organic host materials are each independently one or more selected from the group consisting of 4,4'-di(9-carbazolyl)biphenyl, 1,3-di(carbazol-9-yl)benzene, (triphenylsilyl)-1,3-phenylene)bis-9H-carbazole, 1,3,5-tri(9-carbazolyl)benzene, 4,4',4" tri(carbazol-9-yl)triphenylamine and 4,4'-bis(triphenylsilyl)biphenyl.

* * * * *

UNITED STATES PATENT AND TRADEMARK OFFICE
CERTIFICATE OF CORRECTION

PATENT NO.        : 11,043,648 B2                              Page 1 of 1
APPLICATION NO.   : 16/477557
DATED             : June 22, 2021
INVENTOR(S)       : Zhou et al.

It is certified that error appears in the above-identified patent and that said Letters Patent is hereby corrected as shown below:

In the Claims

Column 24, Line 29, Claim 13:
Please correct "benzene, (triphenylsilyl)" to read -- benzene, 9,9'-(5-(triphenylsilyl) --

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*